(12) United States Patent  
Nakaya et al.

(10) Patent No.: US 6,320,311 B2
(45) Date of Patent: Nov. 20, 2001

(54) ORGANIC EL DEVICE HAVING A HOLE INJECTING ELECTRODE INCLUDING A TRANSPARENT ELECTRODE AND A METAL ELECTRODE

(75) Inventors: Kenji Nakaya; Mitsufumi Codama, both of Ibaraki (JP)

(73) Assignee: TDK Corporation, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/111,178

(22) Filed: Jul. 8, 1998

(30) Foreign Application Priority Data

Jul. 9, 1997 (JP) .................................... 9-199256

(51) Int. Cl.⁷ ................... H01J 1/62; H01J 63/04
(52) U.S. Cl. ............. 313/506; 313/504; 313/510; 313/509
(58) Field of Search ................... 313/498, 500, 313/504, 503, 506, 507, 311, 505, 509, 510; 428/690, 917; 315/169.3

(56) References Cited

U.S. PATENT DOCUMENTS

| | | |
|---|---|---|
| 5,133,036 | 7/1992 | Toernqvist . |
| 5,400,047 * | 3/1995 | Beesely ................... 313/503 |
| 5,804,918 * | 9/1998 | Yazawa et al. ............ 313/506 |
| 5,831,384 * | 11/1998 | Potter ....................... 313/506 |
| 5,923,119 * | 7/1999 | Hara et al. ................ 313/506 |
| 5,936,346 * | 8/1999 | Ishihara et al. .......... 313/506 |
| 5,981,092 * | 11/1999 | Arai et al. ................. 313/504 |
| 5,998,926 * | 12/1999 | Tsuruoka et al. ......... 313/506 |
| 6,008,588 * | 10/1999 | Fujii ......................... 313/504 |
| 6,010,796 * | 1/2000 | Kijima ...................... 313/506 |
| 6,013,383 * | 1/2000 | Shi et al. .................. 313/506 |

FOREIGN PATENT DOCUMENTS

| | | |
|---|---|---|
| 0 421 429 | 4/1991 | (EP) . |
| 0 717 445 | 6/1996 | (EP) . |
| 0 845 924 | 6/1998 | (EP) . |
| 4-82197 | 3/1992 | (JP) . |
| 5-307997 | 11/1993 | (JP) . |
| 6-5369 | 1/1994 | (JP) . |
| 6-45074 | 2/1994 | (JP) . |

OTHER PUBLICATIONS

O. J. Gregory, et al., Journal of the Electrochemical Society, vol. 138, No. 7, pp. 2070 to 2075, "Fabrication of High-–Conductivity, Transparent Electrodes with Trenched Metal Bus Lines", Jul. 1991.

Charles E. Mellor, et al., SPIE Advances in Display Technology IV, vol. 457, pp. 66 to 73, "Fabrication of Electrode Structures on Very Large Electroluminescent Displays", 1984.

* cited by examiner

*Primary Examiner*—Ashok Patel
*Assistant Examiner*—Mariceli Santiago
(74) *Attorney, Agent, or Firm*—Oblon, Spivak, McClelland, Maier & Neustadt, P.C.

(57) ABSTRACT

An organic EL device comprises a hole injecting electrode, an electron injecting electrode, and at least one organic layer located between both the electrodes. The hole injecting electrode comprises a transparent electrode at a light emitting area, and a metal electrode located at a portion other than the light emitting area and having a sheet resistance of 1 Ω/□ or lower.

8 Claims, 8 Drawing Sheets

ORGANIC EL DEVICE HAVING A HOLE INJECTING ELECTRODE INCLUDING A TRANSPARENT ELECTRODE AND A METAL ELECTRODE

BACKGROUND OF THE INVENTION

The present invention relates generally to an organic EL (electroluminescent) device, and specifically to an improvement in or relating to a hole injecting electrode for feeding holes (charges) to a light emitting layer.

In recent years, organic EL devices have been under intensive investigation. One such device is basically built up of a thin film form of hole transporting material such as triphenyldiamine (TPD) deposited by evaporation on a hole injecting electrode, a light emitting layer of fluorescent material such as an aluminum quinolinol complex ($Alq^3$) laminated thereon, and a metal (electron injecting) electrode of a metal having a low work function such as Mg and formed on the light emitting layer. This organic EL device now attracts attentions because a very high luminance ranging from several hundreds to tens of thousands $cd/m^2$ can be achieved with a voltage of approximately 10 V.

A hole injecting electrode considered to be effective for such organic EL devices is made up of a material capable of injecting more electrons into a light emitting layer or a hole injecting and transporting layer. One requirement for the material is that it be transparent and electrically conductive because, in most cases, an organic EL device is usually designed to take out the emitted light from a substrate side thereof.

ITO (tin-doped indium oxide), IZO (zinc-doped indium oxide), ZnO, $SnO_2$, $In_2O_3$, etc. have been known for such transparent electrodes. Among these, ITO electrodes have a visible light transmittance of 90% or higher and a sheet resistance of 10 $\Omega/\square$ or lower, and so find wide applications as transparent electrodes for liquid crystal displays (LCDs), dimmer glasses, and solar batteries. The ITO electrodes are also considered to be promising for hole injecting electrodes in the organic EL devices.

An organic EL device requires a given current for light emission, and the light emission luminance increases in proportion to an applied current density. Consequently, when sophisticated display patterns or large-screen displays are driven with high luminance or at a high duty ratio, the resistance of interconnecting lines in the hole injecting electrode is found to give rise to a voltage drop problem, although this resistance is negligible when the length of interconnecting lines is short. If, for example, a display of 256 dots×64 dots is driven at a light emission luminance of 150 $cd/m^2$, a 1/64second-light emission will occur at a light emission luminance of 150×64 $cd/m^2$. When the sheet resistance of the hole injecting electrode is sufficiently reduced, the device may be driven at a voltage value approximate to an effective applied voltage shown in FIG. 15 for instance. When the resistance of the hole injecting electrode is about 260 $\Omega$, however, a voltage increase of as high as 2 V is needed, as can be seen from the applied voltage shown in FIG. 15. Even with an electrode having a sheet resistance of the order of 7 to 8 $\Omega/\square$ such as a low resistance ITO electrode, a voltage drop across the hole injecting electrode becomes a grave problem because a resistance of 64×7=448 $\Omega$ exists even in a narrow pixel area of 64 dots.

SUMMARY OF THE INVENTION

An object of the invention is to provide an organic EL device which can lower the interconnecting resistance of a hole injecting electrode, and so easily accommodate itself to a sophisticated display pattern or large-screen display designed to be driven with high luminance or at a high duty ratio.

The aforesaid object is achieved by the inventions defined below as (1) to (8).

(1) An organic electroluminescent device comprising a hole injecting electrode, an electron injecting electrode, and at least one organic layer interleaved between both said electrodes, wherein:
said hole injecting electrode comprises a transparent electrode at a light emitting area, and a metal electrode located at a portion other than said light emitting area and connected to said transparent electrode, and having a sheet resistance of 1 $\Omega/\square$ or lower.

(2) The organic electroluminescent device according to (1), wherein said transparent electrode has a thickness of 100 nm or less.

(3) The organic electroluminescent device according to (1) or (2), wherein said transparent electrode is an ITO transparent electrode.

(4) The organic electroluminescent device according to (1) or (2), wherein said transparent electrode is an IZO transparent electrode.

(5) The organic electroluminescent device according to any one of (1) to (4), which further includes a barrier layer between said transparent electrode and said metal electrode.

(6) The organic electroluminescent device of (1), wherein said metal electrode is connected to all the peripheral area of the transparent electrode.

(7) The organic electroluminescent device of (6) forming a segment type display.

(8) The organic electroluminescent device of (6) forming a simple matrix type display.

BRIEF DESCRIPTION OF THE DRAWINGS

The above and other objects, features, and advantages of the invention will be better understood from the following description taken in conjunction with the accompanying drawings.

DETAILED DESCRIPTION OF THE INVENTION

Figure 1:
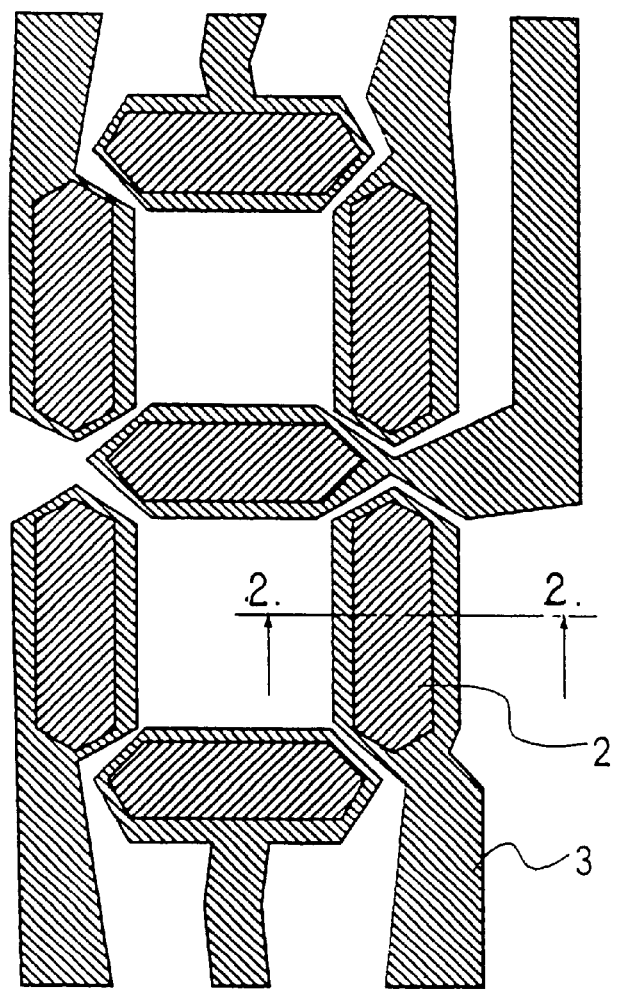
FIG. 1 is a general representation illustrative of a 7-segment type hole injecting electrode that is a first embodiment of the organic EL device according to the invention.

Some illustrative embodiments of the invention will now be explained at great length.

The organic EL device of the invention comprises a hole injecting electrode, an electron injecting electrode, and at least one organic layer interleaved between both the electrodes. The hole injecting electrode comprises a transparent electrode at a light emitting area, and a metal electrode located at a portion other than the light emitting area and electrically connected to the transparent electrode, and having a sheet resistance of 1 $\Omega/\square$ or lower. Thus, the transparent electrode is located at the light emitting area out of which light should be taken, and the metal electrode having a low sheet resistance is located at the non-light emitting area out of which light may not be taken, so that the overall resistance value of the hole injecting electrode can remain low. The metal electrode is connected to all the peripheral or circumferential area of the transparent electrode.

The transparent electrode is located at least at the light emitting area (pixel area). By the term "light emitting area" used herein is intended by an area at which a light emitting layer can give out light, and out of which the emitted light can be taken for use. While the transparent electrode area may be larger than the light emitting area, for instance, the transparent electrode may extend slightly from the periphery of the light emitting area, it is to be understood that as the transparent electrode area becomes larger than required, the resistance of the hole injecting electrode becomes high. Thus, it is preferred that the transparent electrode area is equal to, or slightly larger than, the light emitting area.

For the transparent electrode, it is preferable to use ITO (tin-doped indium oxide), IZO (zinc-doped indium oxide), ZnO, $SnO_2$, $In_2O_3$ or the like, and especially ITO (tin-doped indium oxide), and IZO (zinc-doped indium oxide). It is desired that the mixing ratio of $SnO_2$ with respect to $In_2O_3$ be in the range of 1 to 20 wt %, and especially 5 to 12 wt %. Again, the mixing ratio of ZnO with respect to $In_2O_3$ is preferably in the range of 1 to 20 wt %, and especially 5 to 12 wt %. Besides, ITO, and IZO may contain an oxide form of Sn, Ti, Pb, etc. in an amount of up to 1 wt % calculated as oxide.

The transparent electrode may have at least a certain thickness enough to inject holes, and is usually in the range of 10 to 100 nm. However, a thickness of 30 to 100 nm, and especially 50 to 90 nm is preferred. At a film thickness of up to 100 nm, the transparent electrode has so low surface roughness that its surface properties can be improved, resulting in improvements in light emission properties, light emission life, etc. Too large a thickness offers problems in conjunction with film thickness upon film formation, and the ability of the electrode to transport holes.

The metal electrode has a sheet resistance of preferably 1 $\Omega/\square$ or lower, and especially 0.5 $\Omega/\square$ or lower. Although there is no lower limit on sheet resistance, a sheet resistance of about 0.1 $\Omega/\square$ is generally preferred. Preferably, the metal electrode has a thickness of the order of preferably 10 to 2,000 nm, especially 20 to 1,000 nm, and more especially 100 to 500 nm.

The metal electrode may be made up of metals such as Al, Cu, Au and Ag, or alloys of Al with transition elements such as Sc, Nb, Zr, Hf, Nd, Ta, Cu, Si, Cr, Mo, Mn, Ni, Pd, Pt, and W. However, preference is given to Al, and Al alloys, among which an alloy of Al with at least one transition element is most preferred with an Al content of 90 at % or higher, and preferably 95 at % or higher.

Preferably in the hole injecting electrode of the invention, a barrier metal layer is provided between the transparent electrode and the metal electrode. By the provision of the barrier metal layer, the interface between the transparent electrode and the metal electrode is stabilized with stabilized contact resistance. The barrier metal layer may be made up of metals such as Cr and Ti, and nitrides such as titanium nitride (TiN). However, particular preference is given to Cr, and TiN, because they can be wet etched with a specific reagent having no attack on the transparent electrode such as an ITO electrode. Preferably, the barrier metal layer has a thickness of 10 to 200 nm, and especially 30 to 100 nm.

The transparent electrode, metal electrode, and barrier metal layer may be formed as by evaporation, but should preferably be formed by a sputtering technique. When a sputtering process is applied to the formation of an ITO or IZO transparent electrode, it is preferable to use a target comprising $In_2O_3$ doped with $SnO_2$ or ZnO. When the metal electrode or barrier electrode in a film form is provided, it is preferable to form a sintered product of the aforesaid starting metal material or its alloy by means of a DC or RF sputtering process. An ITO transparent electrode, when formed by the sputtering technique, suffers a lesser light emission luminance change as compared with an electrode formed by evaporation. Power input is preferably in the range of 0.1 to 4 $W/cm^2$. Power input for a DC sputtering system in particular is preferably in the range of 0.1 to 10 $W/cm^2$, and especially 0.2 to 5 $W/cm^2$. The film forming rate is preferably in the range of 2 to 100 nm/min., and especially 5 to 50 nm/min.

Preferably but no exclusively, an inert gas such as Ar, He, Ne, Kr, and Xe or a mixture of such inert gases is used as the sputtering gas. The sputtering pressure of such gases may usually be of the order of 0.1 to 20 Pa.

In the practice of the invention, no particular limitation is imposed on how to provide the transparent electrode, metal electrode, and barrier layer on each of the light emitting area and the non-light emitting area. However, it is preferable to rely upon a patterning technique using an ordinarily available resist material. Etching may be done either wet or dry. An etching solution used for wet etching is preferably an aqueous system for an ITO transparent electrode, and a mixed solution system of phosphoric acid, nitric acid and acetic acid is preferable for a specific metal electrode, e.g., an Al electrode. In the latter case, it is preferable to use an etching solution that enables a specific metal to be selectively etched.

Specific embodiments of the hole injecting electrode according to the invention are now explained with reference to the drawings.

Figure 2:
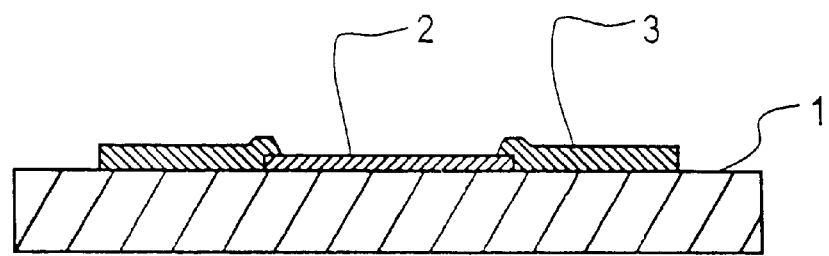
FIG. 2 is a sectional view of FIG. 1 as taken along the A–A' line.

FIG. 1 is a general representation of one embodiment of the hole injecting electrode according to the invention, and FIG. 2 is a sectional view of FIG. 1 as taken along the A–A' line. The hole injecting electrode illustrated has an electrode structure for constructing a so-called 7-segment type display, wherein a transparent electrode 2 and a metal electrode 3 are provided on a substrate 1. The transparent electrode 2 is located at a light emitting (pixel) area of each segment, while the metal electrode is located around the light emitting portion and an interconnection portion extending to a terminal electrode. By locating the transparent electrode at the light emitting area and the metal electrode at a portion other than the light emitting area, it is possible to make resistance low because the resistance of the hole injecting electrode, for the most part, results from the sheet resistance component of the metal electrode.

After the formation of the hole injecting electrode, an insulating layer is provided at a portion other than the light emitting area, optionally or if required, followed by the provision of an element isolating structure. Then, organic layers such as a hole injecting and transporting layer, a light emitting layer and an electron injecting and transporting layer are laminated. Finally, an electron injecting (common) electrode is provided, if required, followed by the lamination of a protective film, etc., thereby assembling a segment type of organic EL display.

FIGS. 3 to 12 are general representations of another embodiment of the hole injecting electrode according to the invention. In other word, the steps of constructing a so-called simple matrix type display are illustrated in order. FIGS. 3, 5, 7, 9, and 11 are plan views, and FIGS. 4, 6, 8, 10, and 12 are sectional views of FIGS. 3, 5, 7, 9, and 11 as taken along the lines B–B', and C–C', respectively.

Figure 3:
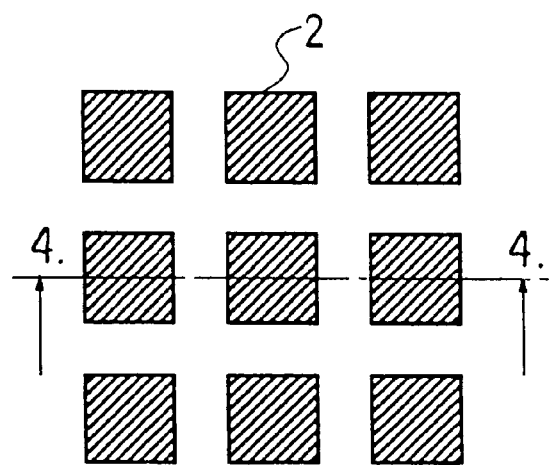
FIG. 3 is a general representation illustrative of the process of forming a simple matrix type hole injecting electrode that is a second embodiment of the organic EL device according to the invention.
Figure 4:
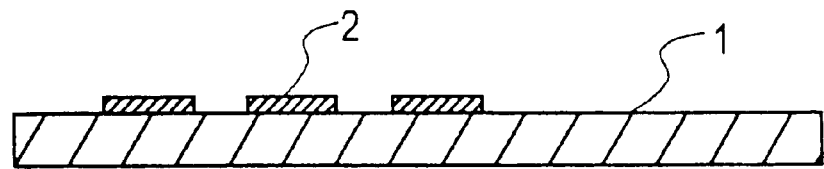
FIG. 4 is a sectional view of FIG. 3 as taken along the B–B' line.
Figure 5:
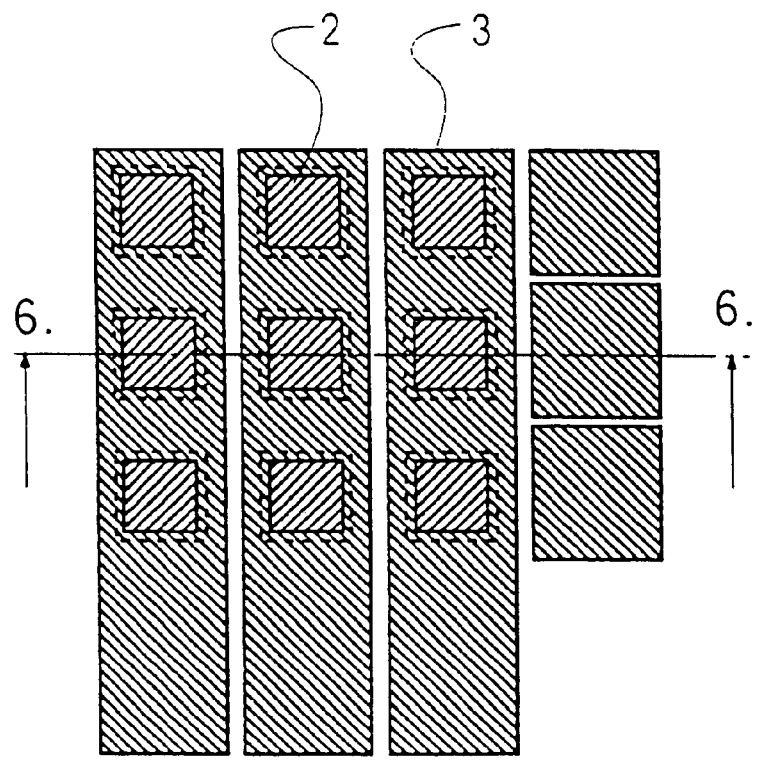
FIG. 5 is a general representation illustrative of the second embodiment of the organic EL device according to the invention, in which the process of forming the metal electrode is illustrated.
Figure 6:
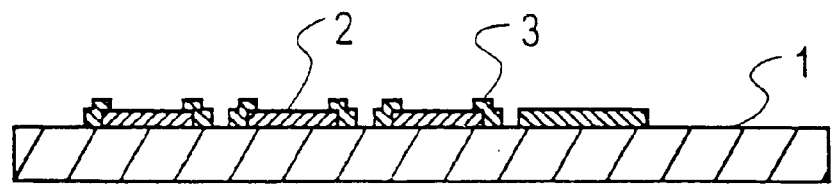
FIG. 6 is a sectional view of FIG. 5 as taken along the B–B' line.
Figure 7:
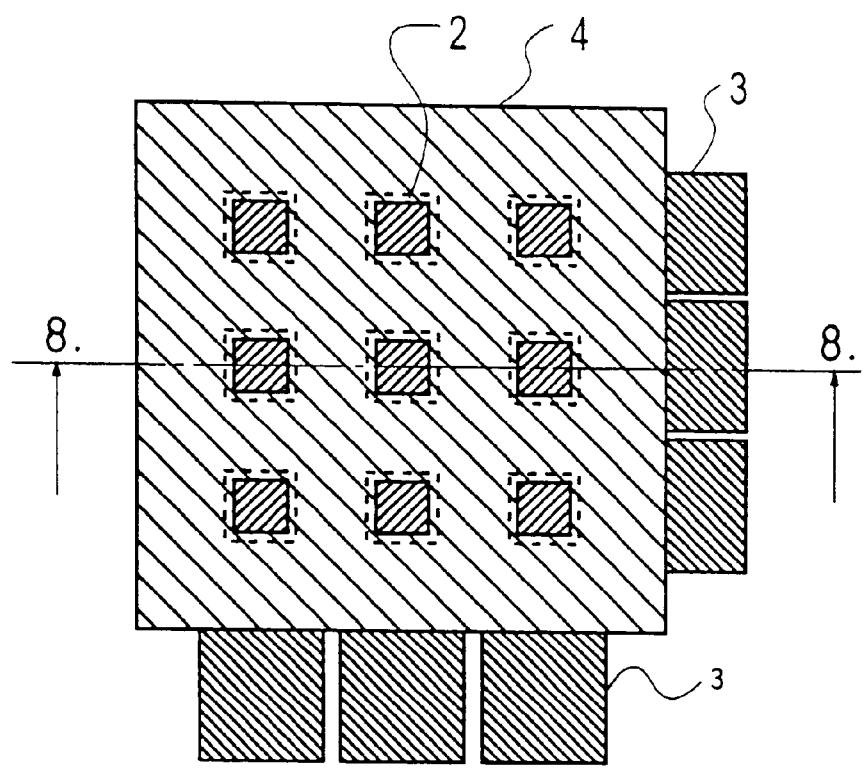
FIG. 7 is a general representation illustrative of the second embodiment of the organic EL device according to the invention, in which the process of forming the insulating film is illustrated.
Figure 8:
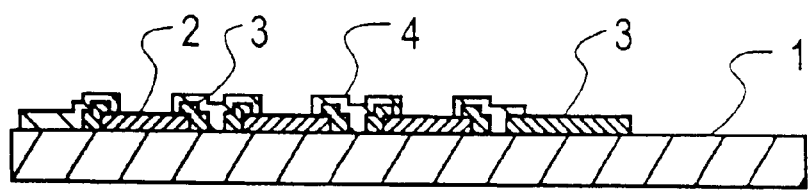
FIG. 8 is a sectional view of FIG. 7 as taken along the B–B' line.

As can be seen from FIGS. 3 and 4, a transparent electrode (ITO) 2 is first provided on a substrate 1 (not shown in the plan view for simplification) according to such a given pattern that non-exclusive scanning lines are formed at a light emitting area, i.e., a pixel area. As shown in FIGS. 5 and 6, then, a metal electrode 3 is formed at a portion other than the light emitting area while the transparent electrode is covered by a part thereof. Subsequently, an insulating layer 4 is provided for the insulation of the portion other than the light emitting area, i.e., the pixel area, as shown in FIGS. 7 and 8.

Figure 9:
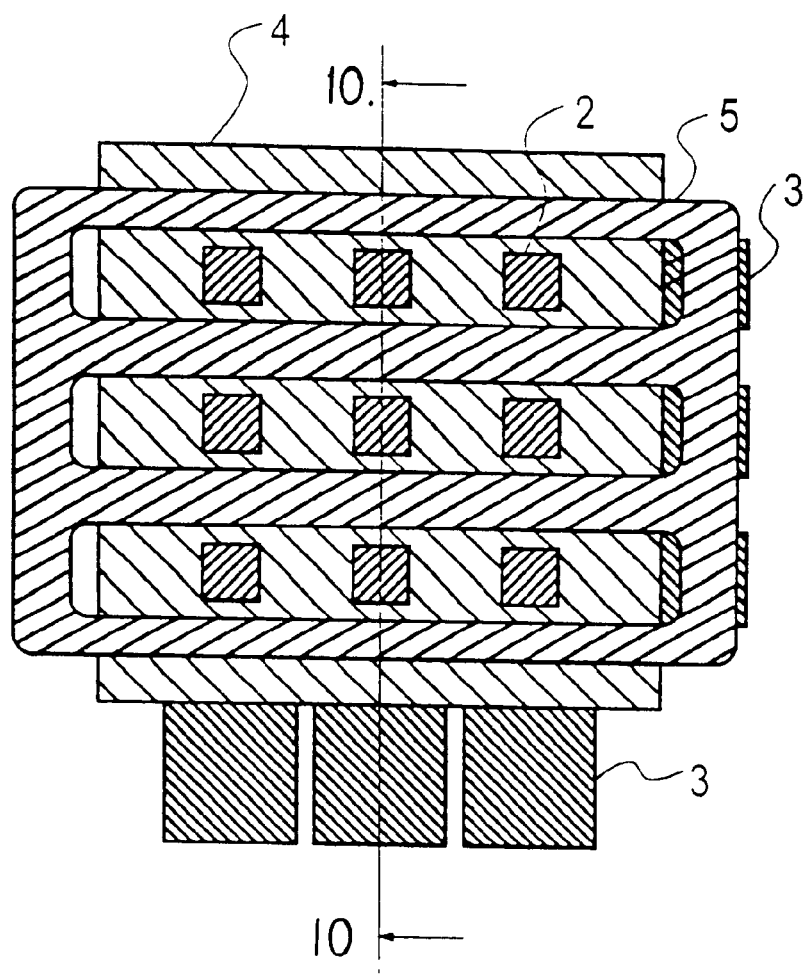
FIG. 9 is a general representation illustrative of the second embodiment of the organic EL device according to the invention, in which the process of forming the element-isolating structure is illustrated.
Figure 10:
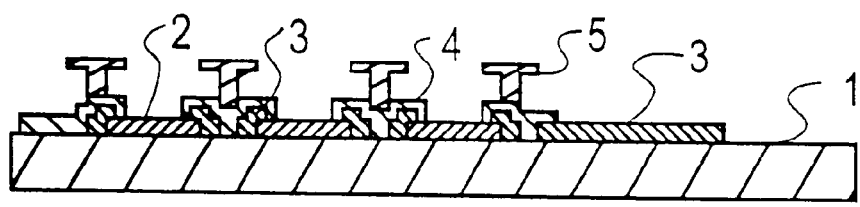
FIG. 10 is a sectional view of FIG. 9 as taken along the C–C' line.
Figure 11:
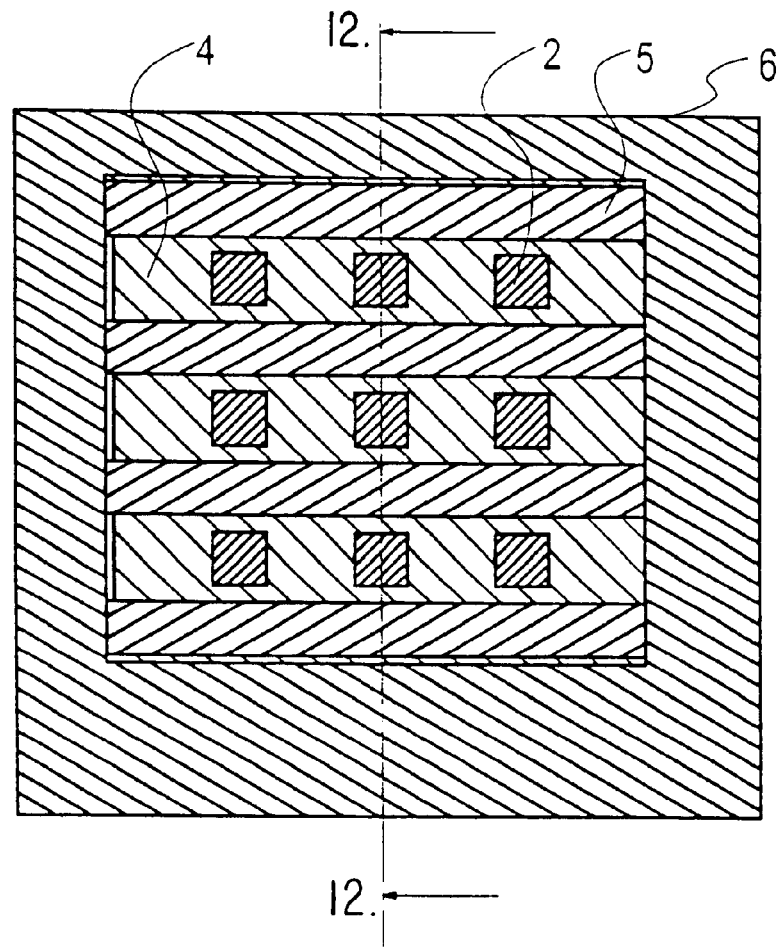
FIG. 11 is a general representation illustrative of the second embodiment of the organic EL device according to the invention, in which the process of mask lamination is illustrated.
Figure 12:
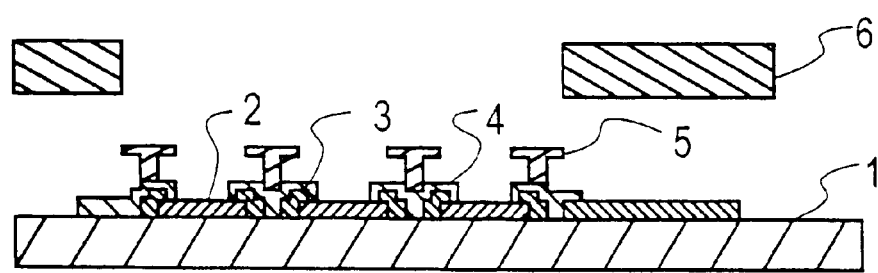
FIG. 12 is a sectional view of FIG. 11 as taken along the C–C' line.

In the embodiment shown in FIGS. 9 and 10, an element isolating structure 5 is provided to form organic layers such as a light emitting layer and an electron injecting electrode in such a manner that non-exclusive scanning lines are formed. This element isolating structure is a solid structure including an overhang portion as shown in FIG. 10. During the formation of the organic layers and electron injecting and transporting layer, evaporated or sputtered particles are deposited at an area except the element isolating structure 5 and its shadows, thereby isolating structural films for each line. For details, see Japanese Patent Application Kokai No. 9-330792. While masked as shown at 6 in FIGS. 11 and 12, the organic layers, electron injecting and transporting layer, etc. are formed to assemble a matrix type of organic EL display. The organic EL device of the invention is not limited to the illustrated embodiment, and so may have various structures; the number of segments and pixels, the pattern thereof, etc. may be properly determined as occasion demands.

The organic layer comprises at least one hole transporting layer and at least one light emitting layer, and include an electron injecting electrode thereon. The organic layer may be provided with a protective electrode in the form of the uppermost layer. It is here to be noted that the hole transporting layer may be dispensed with. The electron injecting electrode is then made up of a metal compound or alloy material having a low work function by means of evaporation or sputtering, and preferably sputtering.

For the material that forms a film form of electron injecting electrode, it is preferable to use a material effective for injection of electrons and having a low work function, e.g., any one of metal elements K, Li, Na, Mg, La, Ce, Ca, Sr, Ba, Al, Ag, In, Sn, Zn, Zr, Cs, Er, Eu, Ga, Hf, Nd, Rb, Sc, Sm, Ta, Y, and Yb, or compounds such as BaO, BaS, CaO, HfC, $LbB_6$, MgO, MoC, NbC, PbS, SrO, TaC, ThC, $ThO_2$, ThS, TiC, TiN, UC, UN, $UO_2$, $W_2C$, $Y_2O_3$, ZrC, ZrN, and $ZrO_2$. To improve the stability of the electrode, it is also preferable to use binary or ternary alloy systems containing metal elements. Preferred alloy systems, for instance, are aluminum alloy systems such as Al.Ca (Ca: 5 to 20 at %), Al.In (In: 1 to 10 at %), Al.Li (0.1 at %$\leq$Li<20 at %), and Al.R where R stands for a rare earth element including Y, and Sc, and In.Mg systems (Mg: 50 to 80 at %). Particular preference is given to pure Al, and aluminum alloy systems such as Al.Li (0.4 at %$\leq$Li<6.5 at % or 6.5 at %$\leq$Li<14 at %), and Al.R (R: 0.1 to 25 at %, especially 0.5 to 20 at %) because they are unlikely to produce compression stress. Thus, such electron injecting electrode-forming metals or alloys are usually employed as sputtering targets. These metals or alloys have a work function of 4.5 eV or lower. In the practice of the invention, it is particularly preferable to use metals or alloys having a work function of 4.0 eV or lower.

In the electron injecting electrode film formed by the sputtering technique, the atoms or atom groups upon sputtering have a kinetic energy relatively higher than would be obtained with the evaporation technique, so that the adhesion of the electron injecting electrode film to the organic layer at their interface is improved due to a surface migration effect. In addition, an oxide layer is removed in vacuum from the surface of the electrode by pre-sputtering or moisture or oxygen is removed from the organic layer interface, on which they are absorbed, by reverse sputtering to form a clean electrode-organic layer interface or a clean electrode, so that consistent organic EL displays of high quality can be produced. For the target, the alloys having the aforesaid composition range, and pure metals may be used alone or in combination with an additional target comprising a subordinate component or components or with the addition of a subordinate component or components thereto. It is also acceptable to use a mixture of materials having largely varying vapor pressures as the target, because there is only slight a deviation of the composition of the resultant film from the target composition. There is thus no limitation on the material used with the sputtering technique, whereas there are some limitations such as vapor pressure on the evaporation technique. The sputtering technique is additionally advantageous over the evaporation technique in terms of consistent film thickness and quality as well as productivity, because it is unnecessary to feed the raw material over an extended period of time.

The electron injecting electrode formed by the sputtering technique is a film so very dense that the penetration of moisture into the film is much more reduced as compared with a coarse film prepared by evaporation, and so the chemical stability of the film is much more increased. This ensures the production of organic EL displays having an ever longer service life.

Preferably, the sputtering gas pressure during sputtering is in the range of 0.1 to 5 Pa. By regulating the sputtering gas pressure within this range, it is possible to easily obtain an AlLi alloy having an Li concentration in the aforesaid range. By altering the sputtering gas pressure in the aforesaid range during film formation, it is also possible to easily obtain an electron injecting electrode having such an Li concentration gradient as defined above. It is also preferable to meet a particular condition that the product of the film forming gas pressure and the substrate-to-target distance must be 20 to 65 Pa·cm.

For the sputtering gas, use is made of inert gases employed with ordinary sputtering systems. For reactive sputtering, reactive gases such as $N_2$, $H_2$, $O_2$, $C_2H_4$, and $NH_3$ may be used in addition to these gases.

In the practice of the invention, it is possible to use an RF sputtering process using an RF power source or the like as the sputtering technique. In view of the ease with which the film forming rate is controlled, and less damage to an organic EL device structure, however, it is preferable to use a DC sputtering process. Power for operating a CD sputtering system is in the range of preferably 0.1 to 10 W/cm$^2$, and especially 0.5 to 7 W/cm$^2$. The film forming rate is preferably in the range of 5 to 100 nm/min., and especially 10 to 50 nm/min.

The thin film form of electron injecting electrode may have at least a certain thickness enough for the injection of electrons, e.g., of at least 1 nm, and preferably at least 3 nm. Thus, a film thickness of the order of 3 to 500 nm is usually preferable although there is no upper limit thereon.

The organic EL display of the invention may preferably have a protective electrode on the electron injecting electrode, i.e., on the side of the electron injecting electrode that is not opposite to the organic layer. By the provision of the protective electrode, the electron injecting electrode is protected against the air, moisture, etc., so that the degradation of the constituting thin film can be prevented, resulting in the stabilization of electron injection efficiency and an ever greater increase in the service life of the device. The protective electrode has a very low resistance, and so may also function as an interconnecting electrode when the electron injecting electrode has a high resistance. The protective electrode may contain at least one of Al; Al and a transition metal except Ti; Ti; and titanium nitride (TiN). When these are used alone, the protective electrode preferably contains Al in an amount of about 90 to 100 at %, Ti in an amount of about 90 to 100 at %, and TiN in an amount of about 90 to 100 mol %. Two or more of Al, Ti and TiN may be used at any desired mixing ratio. For instance, a mixture of Al and Ti preferably contains Ti in an amount of up to 10 at %. Alternatively, it is acceptable to laminate together laminae each containing a single species. In particular, favorable results are obtained when Al or Al plus transition metal are used as the interconnecting electrode to be described later. TiN, on the other hand, provides a film having a striking sealing effect because of its good corrosion resistance. For TiN, an about 10% deviation from its stoichiometric composition is acceptable. In addition, Al alloys, and transition metal alloys may contain transition metals, especially Sc, Nb, Zr, Hf, Nd, Ta, Cu, Si, Cr, Mo, Mn, Ni, Pd, Pt and W in the total amount of up to 10 at %, especially up to 5 at %, and more especially up to 2 at %. When the protective electrode functions as the interconnecting material, the thin film resistance becomes lower with a decrease in the content of the transition metal.

The protective electrode may have at least a certain thickness enough to make sure of electron injection efficiency and prevent penetration of moisture, oxygen or organic solvents, for instance, of at least 50 nm, preferably at least 100 nm, and especially 100 to 1,000 nm. With too thin a protective electrode layer, neither are the advantages of the invention obtainable, nor is sufficient connection with terminal electrodes obtainable because the ability of the protective electrode layer to cover steps becomes low. When the protective electrode layer is too thick, on the other hand, the growth rate of dark spots becomes high because of an increase in the stress of the protective electrode layer. It is here to be noted that when the protective electrode functions as an interconnecting electrode, its thickness may be usually of the order of 100 to 500 nm so as to make up for the high film resistance of the electron injecting electrode due to its thinness, and that when the protective electrode functions as other interconnecting electrode, its thickness may be of the order of 100 to 300 nm.

Preferably but not exclusively, the total thickness of the electron injecting electrode plus the protective electrode is usually of the order of 100 to 1,000 nm.

In addition to the aforesaid protective electrode, an additional protective film may be formed after the formation of the electrode. The protective film may be formed of either an inorganic material such as SiOx or an organic material such as Teflon, and a chlorine-containing carbon fluoride polymer. The protective film may be either transparent or opaque, and has a thickness of the order of 50 to 1,200 nm. The protective film may be formed either by the aforesaid reactive sputtering process or conventional processes such as general sputtering, evaporation or PECVD.

In the practice of the invention, it is preferred to form a sealing layer on the device in order to prevent oxidation of the organic layers and electrodes. The sealing layer for preventing generation of moisture may be formed by bonding sealing plates such as glass plates with adhesive resin layers of low hygroscopicity such as commercially available sheets of photo-curable adhesives, epoxy adhesives, silicone adhesives, and crosslinking ethylene-vinyl acetate copolymer adhesives. Instead of the glass plates, metal or plastic plates may also be used.

Next, the organic material layers provided in the organic EL device of the invention are explained.

The light emitting layer has functions of injecting holes and electrons, transporting them, and recombining holes and electrons to create excitons. For the light emitting layer, it is preferable to use a relatively electronically neutral compound.

The hole injecting and transporting layer has functions of facilitating injection of holes from the anode, providing stable transportation of holes and blocking electrons, and the electron injecting and transporting layer has functions of facilitating injection of electrons from the cathode, providing stable transportation of electrons and blocking holes. These layers are effective for increasing the number of holes and electrons injected into the light emitting layer and confining holes and electrons therein for optimizing the recombination region to improve light emission efficiency.

The thickness of the light emitting layer, the hole injecting and transporting layer, and the electron injecting and transporting layer is not critical and varies with a particular formation technique although it is usually of the order of preferably 5 to 500 nm, and especially 10 to 300 nm.

The thickness of the hole injecting and transporting layers, and the electron injecting and transporting layer is equal to, or about 1/10 times to about 10 times as large as, the thickness of the light emitting layer although it depends on the design of the recombination/light emitting region. When the electron or hole injecting and transporting layer is separated into an injecting layer and a transporting layer, it is preferable that the injecting layer is at least 1 nm thick and the transporting layer is at least 1 nm thick. The upper limit on thickness is usually about 500 nm for the injecting layer and about 500 nm for the transporting layer. The same film thickness applies when two injecting and transporting layers are provided.

In the organic EL device according to the invention, the light emitting layer contains a fluorescent material that is a compound capable of emitting light. The fluorescent material used herein, for instance, may be at least one compound selected from compounds such as those disclosed in JP-A 63-264692, e.g., quinacridone, rubrene, and styryl dyes. Use may also be made of quinoline derivatives such as metal complex dyes containing 8-quinolinol or its derivative as ligands, for instance, tris(8-quinolinolato)aluminum, tetraphenylbutadiene, anthracene, perylene, coronene, and 12-phthaloperinone derivatives. Use may further be made of phenylanthracene derivatives disclosed in Japanese Patent Application Kokai No. 8-12600, and tetraarylethene derivatives disclosed in Japanese Patent Application Kokai No. 8-12969.

Preferably, the fluorescent compound is used in combination with a host substance capable of emitting light by itself; that is, it is preferable that the fluorescent compound is used as a dopant. In such a case, the content of the fluorescent compound in the light emitting layer is in the range of preferably 0.01 to 10% by weight, and especially 0.1 to 5% by weight. By using the fluorescent compound in combination with the host substance, it is possible to vary the wavelength performance of light emission, thereby making light emission possible on a longer wavelength side and, hence, improving the light emission efficiency and stability of the device.

Quinolinolato complexes, and aluminum complexes containing 8-quinolinol or its derivatives as ligands are preferred for the host substance. Such aluminum complexes are typically disclosed in JP-A's 63-264692, 3-255190, 5-70733, 5-258859, 6-215874, etc.

Exemplary aluminum complexes include tris(8-quinolinolato)aluminum, bis(8-quinolinolato)magnesium, bis(benzoff-8-quinolinolato)zinc, bis(2-methyl-8-quinolinolato)aluminum oxide, tris(8-quinolinolato)indium, tris(5-methyl-8-quinolinolato)aluminum, 8-quinolinolato-lithium, tris(5-chloro-8-quinolinolato)gallium, bis(5-chloro-8-quinolinolato)calcium, 5,7-dichloro-8-quinolinolato-aluminum, tris(5,7-dibromo-8-hydroxyquinolinolato)aluminum, and poly[zinc(II)-bis(8-hydroxy-5-quinolinyl)methane].

Use may also be made of aluminum complexes containing other ligands in addition to 8-quinolinol or its derivatives, for instance, bis(2-methyl-8-quinolinolato)(phenolato) aluminum (III), bis(2-methyl-8-quinolinolato)(o-cresolato) aluminum (III), bis(2-methyl-8-quinolinolato)(m-cresolato) aluminum (III), bis(2-methyl-8-quinolinolato)(p-cresolato) aluminum (III), bis(2-methyl-8-quinolinolato)(o-phenylphenolato)aluminum (III), bis(2-methyl-8-quinolinolato) (m-phenylphenolato)aluminum (III), bis(2-methyl-8-quinolinolato) (p-phenylphenolato)aluminum (III), bis(2-methyl-8-quinolinolato) (2,3-dimethylphenolato) aluminum (III), bis(2-methyl-8-quinolinolato) (2,6-dimethylphenolato)aluminum (III), bis(2-methyl-8-quinolinolato) (3,4-dimethylphenolato)aluminum (III), bis(2-methyl-8-quinolinolato)(3,5-dimethyl-phenolato) aluminum (III), bis(2-methyl-8-quinolinolato)(3,5-di-tert-butylphenolato)aluminum (III), bis(2-methyl-8-quinolinolato) (2,6-diphenylphenolato)aluminum (III), bis(2-methyl-8-quinolinolato) (2,4,6-triphenylphenolato) aluminum (III), bis(2-methyl-8-quinolinolato) (2,3,6-trimethylphenolato)aluminum (III), bis(2-methyl-8-quinolinolato) (2,3,5,6-tetramethylphenolato)aluminum (III), bis(2-methyl-8-quinolinolato) (1-naphtholato) aluminum (III), bis(2-methyl-8-quinolinolato) (2-naphtholato)aluminum (III), bis(2,4-dimethyl-8-quinolinolato) (o-phenylphenolato)aluminum (III), bis(2,4-dimethyl-8-quinolinolato) (p-phenylphenolato)aluminum (III), bis(2,4-dimethyl-8-quinolinolato) (m-phenylphenolato) aluminum (III), bis(2,4-dimethyl-8-quinolinolato) (3,5-dimethylphenolato)aluminum (III), bis(2,4-dimethyl-8-quinolinolato) (3,5-di-tert-butylphenolato) aluminum (III), bis(2-methyl-4-ethyl-8-quinolinolato) (p-cresolato)aluminum (III), bis(2-methyl-4-methoxy-8-quinolinolato) (p-phenyl-phenolato)aluminum (III), bis(2-methyl-5-cyano-8-quinolinolato) (o-cresolato)aluminum (III), and bis(2-methyl-6-trifluoromethyl-8-quinolinolato) (2-naphtholato)aluminum (III).

Besides, use may be made of bis(2-methyl-8-quinolinolato)aluminum (III)-$\mu$-oxo-bis(2-methyl-8-quinolinolato) aluminum (III), bis(2,4-dimethyl-8-quinolinolato)aluminum (III)-$\mu$-oxo-bis(2,4-dimethyl-8-quinolinolato)aluminum (III), bis(4-ethyl-2-methyl-8-quinolinolato)aluminum (III)-$\mu$-oxo-bis(4-ethyl-2-methyl-8-quinolinolato)aluminum (III), bis(2-methyl-4-methoxyquinolinolato)aluminum (III)-$\mu$-oxo-bis(2 methyl-4-methoxyquinolinolato)aluminum (III), bis(5-cyano-2-methyl-8-quinolinolato)aluminum (III)-$\mu$-oxo-bis(5-cyano-2-methyl-8-quinolinolato)aluminum (III), bis(2-methyl-5-trifluoromethyl-8-quinolinolato)aluminum (III)-$\mu$-oxo-bis(2-methyl-5-trifluoromethyl-8-quinolinolato)aluminum (III), etc.

Other preferable host substances include phenylanthracene derivatives disclosed in Japanese Patent Application Kokai No. 8-12600, tetraarylethene derivatives disclosed in Japanese Patent Application Kokai No. 8-12969, etc.

In the practice of the invention, the light emitting layer may also serve as an electron injecting and transporting layer. In this case, it is preferable to use a fluorescent material, e.g., tris(8-quinolinolato)aluminum or the like, which may be provided by evaporation.

If necessary or preferably, the light emitting layer is formed of a mixed layer of at least one compound capable of injecting and transporting holes with at least one compound capable of injecting and transporting electrons. Preferably in this case, a dopant is incorporated in the mixed layer. The content of the dopant compound in the mixed layer is in the range of preferably 0.01 to 20% by weight, and especially 0.1 to 15% by weight.

In the mixed layer with a hopping conduction path available for carriers, each carrier migrates in the polarly prevailing substance, so making the injection of carriers having an opposite polarity unlikely to occur. This leads to an increase in the service life of the device due to less damage to the organic compound. By incorporating the aforesaid dopant in such a mixed layer, it is possible to vary the wavelength performance of light emission that the mixed layer itself possesses, thereby shifting the wavelength of light emission to a longer wavelength side and improving the intensity of light emission, and the stability of the device as well.

The compound capable of injecting and transporting holes and the compound capable of injecting and transporting electrons, both used to form the mixed layer, may be selected from compounds for the injection and transportation of holes and compounds for the injection and transportation of electrons, as will be described later. Especially for the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring.

For the compounds capable of injecting and transporting electrons, it is preferable to use metal complexes containing quinoline derivatives, especially 8-quinolinol or its derivatives as ligands, in particular, tris(8-quinolinolato) aluminum ($Alq^3$). It is also preferable to use the aforesaid phenylanthracene derivatives, and tetraarylethene derivatives.

For the compounds for the injection and transportation of holes, it is preferable to use amine derivatives having strong fluorescence, for instance, hole transporting materials such as triphenyldiamine derivatives, styrylamine derivatives, and amine derivatives having an aromatic fused ring.

In this case, the ratio of mixing the compound capable of injecting and transporting holes with the compound capable of injecting and transporting electrons is determined while the carrier mobility and carrier density are taken into consideration. In general, however, it is preferred that the weight ratio between the compound capable of injecting and transporting holes and the compound capable of injecting and transporting electrons is of the order of 1/99 to 99/1, particularly 10/90 to 90/10, and more particularly 20/80 to 80/20.

The thickness of the mixed layer must correspond to the thickness of a single molecular layer, and so is preferably less than the thickness of the organic compound layer. More specifically, the mixed layer has a thickness of preferably 1 to 85 nm, especially 5 to 60 nm, and more especially 5 to 50 nm.

Preferably, the mixed layer is formed by co-evaporation where the selected compounds are evaporated from different evaporation sources. When the compounds to be mixed have identical or slightly different vapor pressures (evaporation temperatures), however, they may have previously been mixed together in the same evaporation boat for the subsequent evaporation. Preferably, the compounds are uniformly mixed together in the mixed layer. However, the compounds in an archipelagic form may be present in the mixed layer. The light emitting layer may generally be formed at a given thickness by the evaporation of the organic fluorescent substance or coating a dispersion of the organic fluorescent substance in a resin binder.

For the hole injecting and transporting layer, use may be made of various organic compounds as disclosed in JP-A's 63-295695, 2-191694, 3-792, 5-234681, 5-239455, 5-299174, 7-126225, 7-126226 and 8-100172 and EP 0650955A1. Examples are tetraarylbenzidine compounds (triaryldiamine or triphenyldiamine (TPD)), aromatic tertiary amines, hydrazone derivatives, carbazole derivatives, triazole derivatives, imidazole derivatives, oxadiazole derivatives having an amino group, and polythiophenes. Where these compounds are used in combination of two or more, they may be stacked as separate layers, or otherwise mixed.

When the hole injecting and transporting layer is provided as a separate hole injecting layer and a separate hole transporting layer, two or more compounds are selected in a preferable combination from the compounds already mentioned for the hole injecting and transporting layer. In this regard, it is preferred to laminate layers in such an order that a compound layer having a lower ionization potential is disposed nearest to the hole injecting electrode (ITO, etc.). It is also preferred to use a compound having good thin film forming ability at the anode surface. This order of lamination holds for the provision of two or more hole injecting and transporting layers, and is effective as well for lowering driving voltage and preventing the occurrence of current leakage and the appearance and growth of dark spots. Since evaporation is utilized in the manufacture of devices, films as thin as about 1 to 10 nm can be formed in a uniform and pinhole-free state, which restrains any change in color tone of light emission and a drop of efficiency by re-absorption even if a compound having a low ionization potential and absorption in the visible range is used in the hole injecting layer. Like the light emitting layer and so on, the hole injecting and transporting layer or layers may be formed by evaporating the aforesaid compounds.

For the electron injecting and transporting layer which is provided if necessary, there may be used quinoline derivatives such as organic metal complexes containing 8-quinolinol or its derivatives as ligands, for instance, tris (8-quinolinolato)aluminum ($Alq^3$), oxadiazole derivatives, perylene derivatives, pyridine derivatives, pyrimidine derivatives, quinoxaline derivative, diphenylquinone derivatives, and nitro-substituted fluorene derivatives. The electron injecting and transporting layer may also serve as a light emitting layer. In this case, it is preferable to use tris(8-quinolilato)aluminum, etc. As is the case with the light emitting layer, the electron injecting and transporting layer may then be formed by evaporation or the like.

Where the electron injecting and transporting layer is a double-layered structure comprising an electron injecting layer and an electron transporting layer, two or more compounds are selected in a preferably combination from the compounds commonly used for electron injecting and transporting layers. In this regard, it is preferred to laminate layers in such an order that a compound layer having a greater electron affinity is disposed nearest to the cathode. This order of lamination also applies where a plurality of electron injecting and transporting layers are provided.

For the substrate material, transparent or translucent materials such as glass, quartz and resins are used. The substrate may be provided with a color filter film, fluorescent material-containing color conversion film or dielectric reflecting film for controlling the color of light emission.

For the color filter film, a color filter employed with liquid crystal display devices may be used. However, it is preferable to control the properties of the color filter in conformity to the light emitted from the organic EL device, thereby optimizing the efficiency of taking out light emission and color purity.

By using a color filter capable of cutting off extraneous light of such short wavelength as absorbed by the EL device material or the fluorescent conversion layer, it is possible to improve the light resistance of the device and the contrast of what is displayed on the device.

Instead of the color filter, an optical thin film such as a dielectric multilayer film may be used.

The fluorescent color conversion film absorbs light emitted from an EL device and gives out light from the phosphors contained therein for the color conversion of light emission, and is composed of three components, a binder, a fluorescent material and a light absorbing material.

In the practice of the invention, it is basically preferable to use a fluorescent material having high fluorescent quantum efficiency, and especially a fluorescent material having strong absorption in an EL light emission wavelength region. Laser dyes are suitable for the practice of the invention. To this end, for instance, it is preferable to use rohodamine compounds, perylene compounds, cyanine compounds, phthalocyanine compounds (including subphthalocyanine compounds, etc.), naphthaloimide compounds, fused cyclic hydrocarbon compounds, fused heterocyclic compounds, styryl compounds, and coumarin compounds.

For the binder, it is basically preferable to make an appropriate selection from materials that do not extinguish fluorescence. It is particularly preferable to use a material that can be finely patterned by photolithography, printing or the like. It is also preferable to use a material that is not damaged during ITO or IZO film formation.

The light absorbing material is used when light is not fully absorbed by the fluorescent material, and so may be dispensed with, if not required. For the light absorbing material, it is preferable to make a selection from materials that do not extinguish fluorescence.

To form the hole injecting and transporting layer, the light emitting layer and the electron injecting and transporting layer, it is preferable to use a vacuum evaporation technique which enables a homogeneous thin film to be obtained. According to the vacuum evaporation process, it is possible to obtain homogeneous thin films in an amorphous state or with a crystal grain diameter of at most 0.1 $\mu$m. The use of a thin film having a crystal grain diameter exceeding 0.1 $\mu$m results in non-uniform light emission. To avoid this, it is required to increase the driving voltage of the device; however, there is a striking drop of charge injection efficiency.

No particular limitation is imposed on vacuum evaporation conditions. However, an evaporation rate of the order of 0.01 to 1 nm/sec. is preferably applied at a degree of vacuum of $10^{-4}$ Pa or lower. It is also preferable to form the layers continuously in vacuum. If the layers are continuously formed in vacuum, high properties are then obtained because the adsorption of impurities on the interface between the adjacent layers can be avoided. Furthermore, the driving voltage of the device can be lowered while the growth and occurrence of dark spots are inhibited.

When the vacuum evaporation process is used to form the layers, each containing a plurality of compounds, it is preferable to carry out co-evaporation while boats charged with the compounds are individually placed under temperature control.

The organic EL device of the invention is generally of the DC drive type while it may be of the AC or pulse drive type. The applied voltage is generally of the order of 2 to 20 volts.

EXAMPLE

The present invention are explained more specifically with reference to some illustrative examples.

Example 1

A glass substrate was provided thereon with an 85 nm-thick ITO transparent electrode (hole injecting electrode), and pixels of 280×280 $\mu$m$^2$ size were patterned on the ITO transparent electrode at an interval of 20 $\mu$m and according to an array of 64 dots×7 lines. Then, an about 1.2 $\mu$m-thick Al-W (W: 3.0 at %) alloy electrode (having a sheet resistance of 0.4 $\Omega$/□) was patterned around the ITO transparent electrode. Used for metal electrodes between pixels, and lines was a common electrode. The resistance of the obtained hole injecting electrode was measured. As a result, it was found that the obtained resistance value is 1/50 or lower of that of a hole injecting electrode made up of ITO alone, as can be seen from a resistance of 64 $\Omega$ obtained for each line.

Example 2

A hole injecting electrode comprising a metal electrode and an ITO transparent electrode prepared as in Example 1 with the exception that the film thickness was changed to 120 nm was formed on a substrate, which was in turn ultrasonically washed with neutral detergent, acetone, and ethanol, and then pulled up from boiling ethanol, followed by drying. This substrate was cleaned on its surface with UV/O$_3$, and fixed to a substrate holder in a vacuum evaporation system, which was evacuated to a vacuum of 1×10$^{-4}$ Pa or lower. 4,4',4"-tris(-N-methylphenyl)-N-phenylamino) triphenylamine (hereinafter m-MTDATA for short) was deposited by evaporation at a deposition rate of 0.2 nm/sec. to a thickness of 40 nm, thereby forming a hole injecting layer. With the vacuum still maintained, N,N'-diphenyl-N, N'-m-tolyl-4,4'-diamino-1,1'-biphenyl (hereinafter TPD for short) was then deposited by evaporation at a deposition rate of 0.2 nm/sec. to a thickness of 35 nm, thereby forming a hole transporting layer. With the vacuum still kept, tris(8-quinolinolato)aluminum (hereinafter Alq$^3$ for short) was deposited by evaporation at a deposition rate of 0.2 nm/sec. to a thickness of 50 nm, thereby forming a combined electron injecting/transporting and light emitting layer. With the vacuum still kept, MgAg was deposited by co-evaporation at an evaporation rate ratio of Mg:Ag=10:1 to a thickness of 200 nm, thereby forming an electron injecting layer.

The thus assembled organic EL device was driven in a dry air atmosphere in such a way that a luminance of 100 cd/m$^2$ was obtained. By comparison, it was found that there is no difference between the light emission luminance at 7 dots×7 lines on the current feed (terminal electrode) side of the organic EL device and that on the opposite (end) side thereof. This showed that there is no influence due to a voltage drop.

Example 3

An organic EL device was obtained as in Example 2 with the exception that the thickness of the ITO transparent electrode was changed to 50 nm. This device was driven for 5,000 hours. The density of dark spots found decreased to ½ or lower. From this, it was found that the reliability of the device is much more improved.

The obtained organic EL device was driven as in Example 2 for estimation purposes. Again, substantially similar results as in Example 2 were obtained with less luminance variations.

Example 4

Organic EL devices were obtained as in Example 2 with the exception that the metal electrode-forming material was changed from Al to Al—Si—Cu (Si: 0.97 at %, Cu:0.53 at %), Al—Nd (Nd: 2.1 at %), Al—Ta (Ta: 2.1 at %), Al—Sc (Sc: 0.13 at %), and Al—W (W: 2.0 at %), respectively.

As a result of estimation of the obtained organic EL devices made as in Example 2, substantially similar results as in Example 2 were obtained.

Example 5

An organic EL device was prepared as in Example 2. However, a Cr barrier layer of 15 μm in width and 60 nm in thickness was formed at an interface portion between the ITO transparent electrode provided and the surrounding metal electrode. The metal electrode was formed as in Example 2.

As a result of estimation of the obtained organic EL device made as in Example 2, substantially similar results as in Example 2 were obtained.

Example 6

Organic EL devices were obtained as in Example 5 with the exception that the barrier layer-forming material was changed from Cr to Ti, and TiN (N: 52 at %), respectively. As a result of estimation of these devices made as in Example 5, much the same results as in Example 5 were obtained.

Example 7

An organic EL device was obtained as in Example 2 with the exception that an IZO transparent prepared as in Example 1 was used.

The obtained EL device was driven and estimated as in Example 2. As a result, much the same results as in Example 2 were obtained.

Example 8

Figure 13:
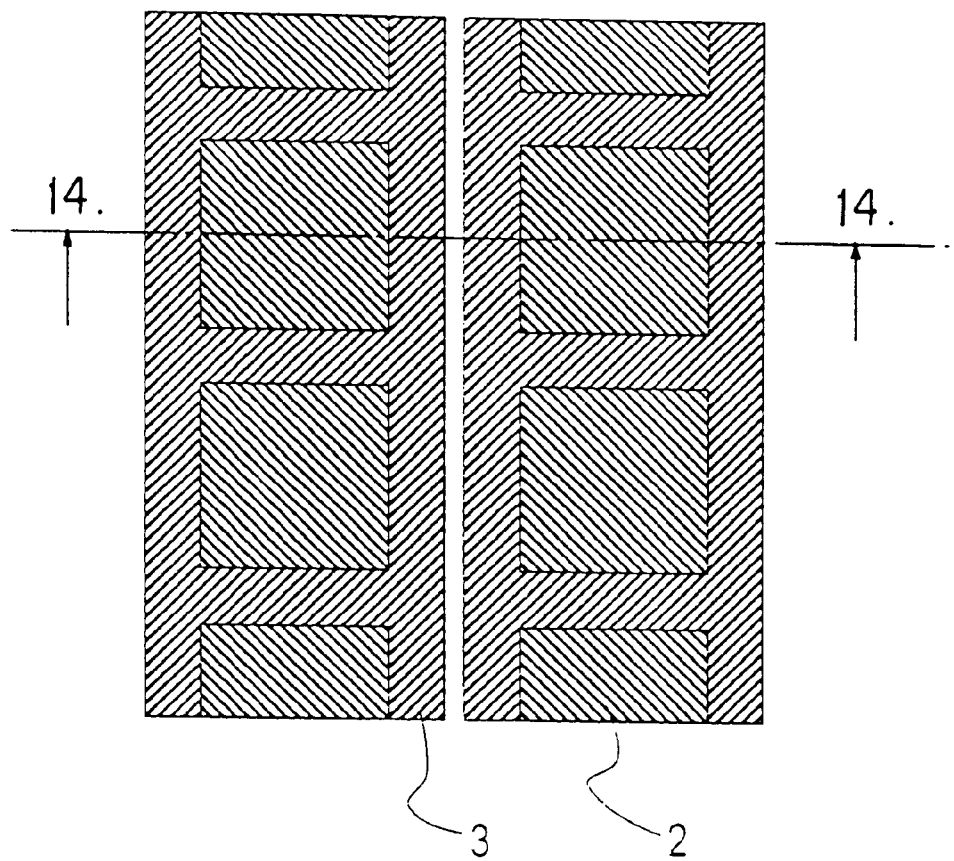
FIG. 13 is a partial plan view illustrative of one exemplary pattern of the ITO transparent electrode and metal electrode according to the invention.
Figure 14:
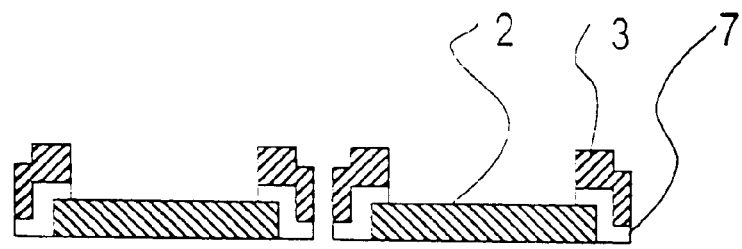
FIG. 14 is a sectional view of FIG. 13 as taken along the D–D' line.
Figure 15:
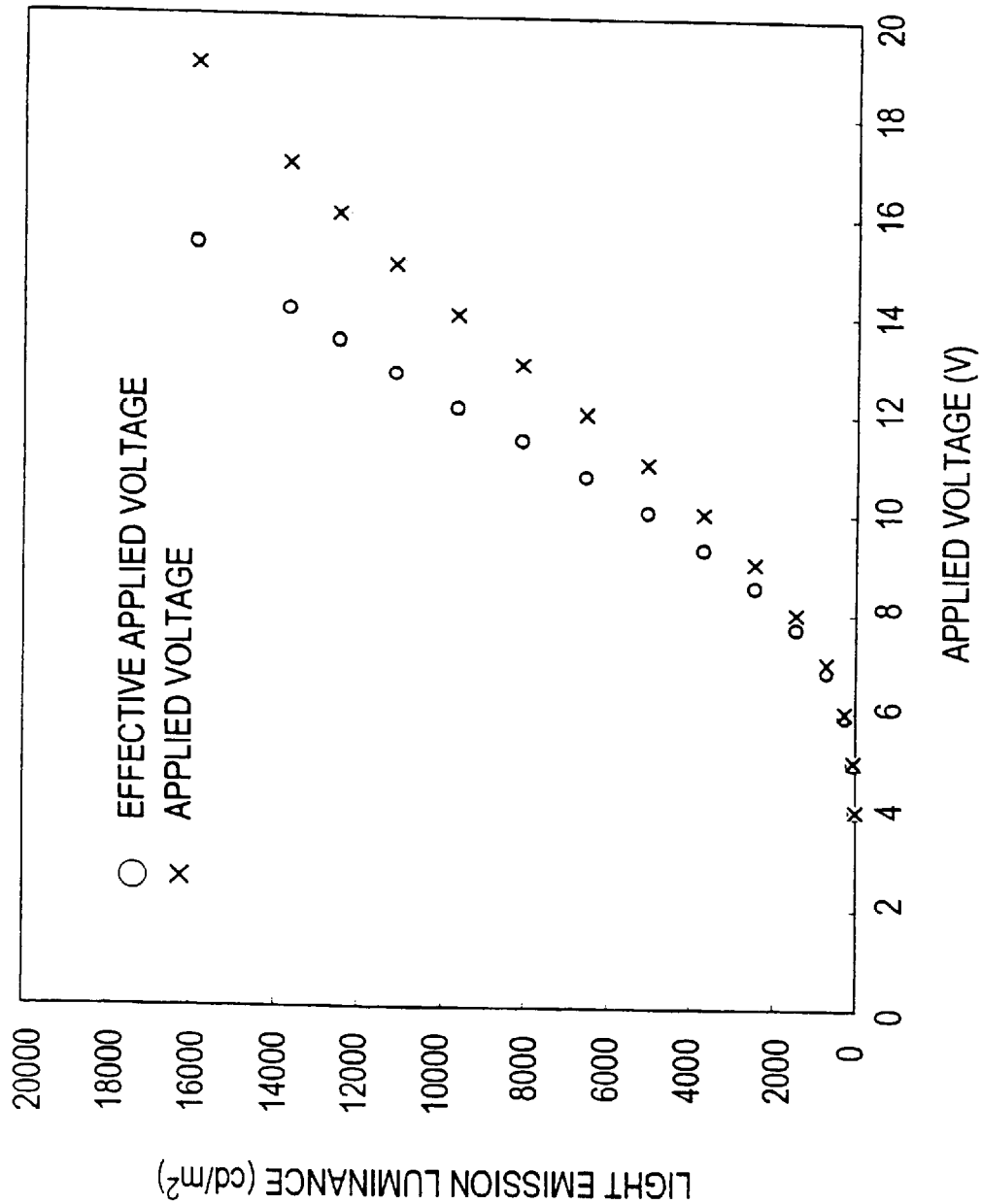
FIG. 15 is a graph illustrative of a specific applied voltage vs. light emission luminance relation of the organic EL device.

As shown in FIGS. 13 and 14, a glass substrate was provided thereon with a 95 nm-thick ITO transparent electrode (hole injecting electrode) 2, and pixels of 280×280 $\mu m^2$ size were patterned on the ITO transparent electrode at an interval of 20 μm and according to an array of 64 dots×256 lines. FIG. 13 is a partial plan view illustrative of a pattern of the ITO transparent electrode and metal electrode, and FIG. 14 is a perspective view of FIG. 13 as taken along the D–D' line. Then, a Cr barrier layer 7 of 100 nm in thickness and an Al metal electrode 3 of 300 nm in thickness (and having a sheet resistance of 0.1 Ω/□) were continuously formed and patterned at a total width of 30 μm around the ITO transparent electrode.

The hole injecting electrode comprising the ITO transparent electrode and metal electrode was formed on a substrate, which was in turn ultrasonically washed with neutral detergent, acetone, and ethanol, and then pulled up from boiling ethanol, followed by drying. This substrate was then cleaned on its surface with UV/O$_3$, and fixed to a substrate holder in a vacuum evaporation system, which was evacuated to a vacuum of 1×10$^{-4}$ Pa or lower. 4,4',4''-tris(-N-methylphenyl)-N-phenylamino)triphenylamine (m-MTDATA) was deposited by evaporation at a deposition rate of 0.2 nm/sec. to a thickness of 40 nm, thereby forming a hole injecting layer. With the vacuum still maintained, N,N'-diphenyl-N,N'-m-tolyl-4,4'-diamino-1,1'-biphenyl (TPD) was then deposited by evaporation at a deposition rate of 0.2 nm/sec. to a thickness of 35 nm, thereby forming a hole transporting layer. With the vacuum still kept, tris(8-quinolinolato)aluminum (Alq$^3$) was deposited by evaporation at a deposition rate of 0.2 nm/sec. to a thickness of 50 nm, thereby forming a combined electron injecting/transporting and light emitting layer. With the vacuum still kept, MgAg was deposited by co-evaporation at an evaporation rate ratio of Mg:Ag=10:1 to a thickness of 200 nm, thereby forming an electron injecting layer.

The thus assembled organic EL device was driven in a dry air atmosphere in such a way that a luminance of 100 cd/m$^2$ was obtained. The luminance of the organic EL device from the current feed side to the opposite (end) side thereof was measured with the range of 7 dots×7 lines on the current feed (terminal electrode) side defined as one measurement unit. Consequently, it was found that the light emission luminance change across the device was within –5% with respect to the time-average light emission luminance of 100 cd/m$^2$ on the current feed side of the device. From this, it was found that even a display having a large display area is little affected by a voltage drop.

Comparative Example 1

An organic EL device was obtained as in Example 1 with the exception that a hole injecting electrode was formed only by use of an ITO transparent electrode. In this case, the resistance of the hole injecting electrode per line was 3.2 kΩ.

The obtained organic EL device was driven and estimated as in Example 1. Consequently, it was found that the luminance change shows a high of –20% with respect to the time-average light emission luminance of 100 cd/m$^2$ on the current feed side of the device.

According to the present invention, it is possible to achieve an organic EL device which can reduce the interconnecting resistance of a hole injecting electrode, and so accommodate itself to sophisticated display patterns or large-screen displays designed to be driven with high luminance or at a high duty ratio, as can be understood from the foregoing.

Japanese Patent Application No. 199256/1997 is herein incorporated by reference.

While the invention has been described with reference to preferred embodiments, it will be obvious to those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiments disclosed as the best mode contemplated for carrying out the invention, but that the invention will include all embodiments falling within the scope of the appended claims.

What we claim is:

1. An organic electroluminescent device comprising a hole injecting electrode, an electron injecting electrode, and at least one organic layer interleaved between both said electrodes, wherein:

said hole injecting electrode comprises a transparent electrode at a light emitting area, and a metal electrode located at a portion other than said light emitting area and connected to said transparent electrode, and having a sheet resistance of 1 Ω/□ or lower, wherein said metal electrode is connected to all the peripheral area of the transparent electrode, and wherein an insulating layer is provided on the metal electrode for insulation of the portion other than the light emitting area.

2. The organic electroluminescent device of claim 1, wherein said transparent electrode has a thickness of 100 nm or less.

3. The organic electroluminescent device of claim 1, wherein said transparent electrode is an ITO transparent electrode.

4. The organic electroluminescent device of claim 1, wherein said transparent electrode is an IZO transparent electrode.

5. The organic electroluminescent device of claim 1, which further includes a barrier layer between said transparent electrode and said metal electrode.

6. The organic electroluminescent device of claim 1, wherein said metal electrode overlaps the transparent electrode at the periphery thereof.

7. A segment type display comprising the organic electroluminescent device of claim 6.

8. A simple matrix type display comprising the organic electroluminescent device of claim 6.

* * * * *